(12) United States Patent
Yamamura

(10) Patent No.: US 8,816,393 B2
(45) Date of Patent: Aug. 26, 2014

(54) SEMICONDUCTOR DEVICE

(71) Applicant: Kabushiki Kaisha Toshiba, Tokyo (JP)

(72) Inventor: Takuji Yamamura, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 3 days.

(21) Appl. No.: 13/776,899

(22) Filed: Feb. 26, 2013

(65) Prior Publication Data

US 2013/0228787 A1 Sep. 5, 2013

(30) Foreign Application Priority Data

Mar. 2, 2012 (JP) ................... 2012-046456

(51) Int. Cl.
*H01L 31/0328* (2006.01)
*H01L 31/0336* (2006.01)

(52) U.S. Cl.
USPC .............. 257/192; 257/194; 257/195; 257/76

(58) Field of Classification Search
USPC .................... 257/192, 194–195, 76, E29.246, 257/E29.247; 438/285, 590
See application file for complete search history.

(56) References Cited

U.S. PATENT DOCUMENTS

2002/0017648 A1* 2/2002 Kasahara et al. ............... 257/79
2006/0006415 A1 1/2006 Wu et al.

FOREIGN PATENT DOCUMENTS

| JP | 10-233404 A | 9/1998 |
|---|---|---|
| JP | 11-168099 A | 6/1999 |
| JP | 2006-286952 A | 10/2006 |
| JP | 2007-537593 | 12/2007 |
| JP | WO2008/053748 A1 | 5/2008 |

OTHER PUBLICATIONS

K. Asano et al. "Novel High Power AlGaAs/GaAs HFET with a Field-Modulating Plate Operated at 35V Drain Voltage", IEDM Technical Digest, IEEE 1998, pp. 59-62.
Y.F. Wu et al. "30-W/mm GaN HEMTs by Field Plate Optimization", IEEE Electron Device Letters, vol. 25, No. 3, Mar. 2004, pp. 117-119.
Huili Xing et al. "High Breakdown Voltage AlGaN-GaN HEMTs Achieved by Multiple Field Plates", IEEE Electron Device Letters, vol. 25, No. 4, Apr. 2004, pp. 161-163.
U.S. Appl. No. 14/018,775, filed Sep. 5, 2013, Yamamura.
Japanese Office Action issued Jan. 28, 2014 in Patent Application No. 2012-046456 with English Translation.

* cited by examiner

*Primary Examiner* — Theresa T Doan
(74) *Attorney, Agent, or Firm* — Oblon, Spivak, McClelland, Maier & Neustadt, L.L.P.

(57) ABSTRACT

A semiconductor device has a shield plate electrode connected to a source terminal electrode near a drain electrode. The source terminal electrode is arranged between an active region AA and a drain terminal electrode, and a shield plate electrode is connected to the source terminal electrode.

15 Claims, 14 Drawing Sheets

US 8,816,393 B2

SEMICONDUCTOR DEVICE

CROSS-REFERENCE TO RELATED APPLICATION

This application is based upon and claims the benefit of priority from the prior Japanese Patent Application No. 2012-046456, filed on Mar. 2, 2012, the entire contents of which are incorporated herein by reference.

FIELD

An embodiment of the present invention relates to a semiconductor device.

BACKGROUND

A source field plate is known as an electric field relaxation technique for a field effect transistor (FET). The source field plate which is arranged between a gate and a drain is capable of relaxing concentration of electric field near a gate electrode, and as a result, an FET improves a withstanding voltage thereof. In order to realize the relaxation of the electric field effectively, the source field plate is arranged near the gate electrode, or is arranged overlapping with the gate electrode.

As for an FET which is capable of operating at high frequency, such as a millimeter wave band, a high gain is expected when it operates at relatively low frequency, such as a microwave band etc. On the other hand, however, suppression of oscillation is difficult because amount of feedback becomes large. When the source field plate is arranged, although the source field plate is effective in suppression of oscillation, the source field plate increases a capacitance Cgs between gate and source because the source field plate which is short-circuited to the source is arranged near the gate. As a result, the gain of the FET decreases.

DETAILED DESCRIPTION

Figure 1:
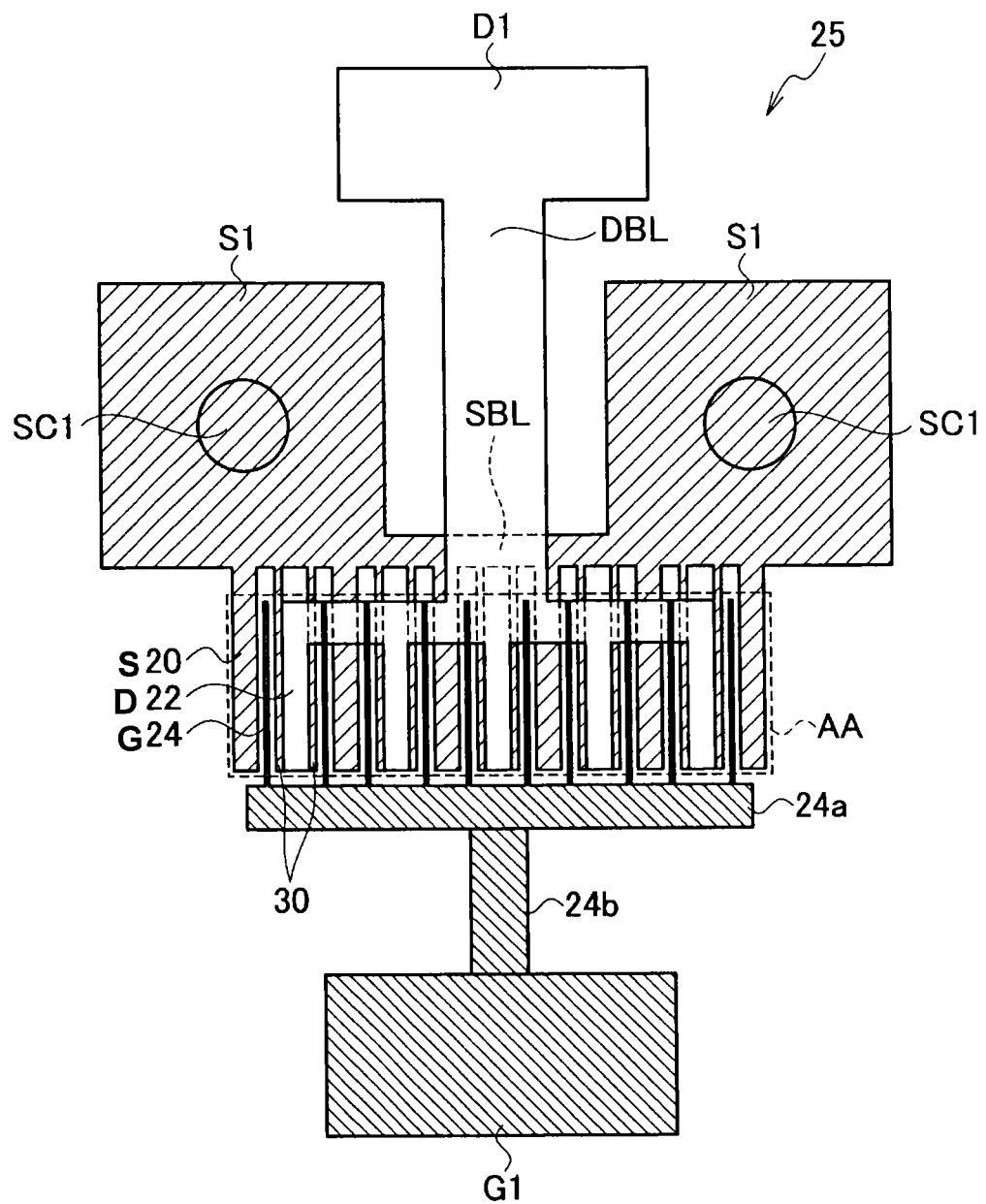
FIG. 1 shows a schematic plane pattern structure of a semiconductor device concerning a first embodiment.

According to embodiments, a semiconductor device, includes: a substrate; a gate electrode which is arranged on a first surface of the substrate and has a plurality of gate finger electrodes; a source electrode which is arranged on the first surface of the substrate and has a plurality of source finger electrodes, and the source finger electrode is close to the gate electrode; a drain electrode which is arranged on the first surface of the substrate and has a plurality of drain finger electrodes, and the drain finger electrode faces the source finger electrode via the gate finger electrode; a gate terminal electrode which is arranged on the first surface of said substrate and is connected to a plurality of the gate finger electrodes; a source terminal electrode which is arranged on the first surface of said substrate and is connected to a plurality of the source finger electrode; a drain terminal electrode which is arranged on the first surface of said substrate and is connected to a plurality of the drain finger electrodes; an insulating layer which is arrange to cover the gate finger electrode, the substrate between the gate finger electrode and the source finger electrode, the substrate between the gate finger electrode and the drain finger electrode, and at least a part of the source finger electrode and at least a part of the drain finger electrode; and a shield plate electrode which is arranged via the insulating layer over the drain finger electrode and the first surface of the substrate between the gate finger electrode and the drain finger electrode, is short-circuited to the source finger electrode, and shields electrically the gate finger electrode and the drain finger electrode from each other; wherein the source terminal electrode is arranged between the gate finger electrodes and the drain terminal electrode, and the shield plate electrode is connected to the source terminal electrode.

Next, the embodiments are described with reference to the drawings. Hereinafter, the same numeral is given to the same element and an overlapping explanation is avoided, thereby an explanation is simplified. The drawings are schematic and you should care that they are different from an actual thing. The drawing contains a portion of an expansion ratio different from the expansion ratio of other portion in the same drawing.

Embodiments shown below illustrates devices and methods for materializing a technical idea, and the embodiments do not specify arrangement of each component part etc. as the followings. Various modifications may be added to the embodiments within coverage of claims attached herewith.

First Embodiment

Semiconductor Device

Figure 2:
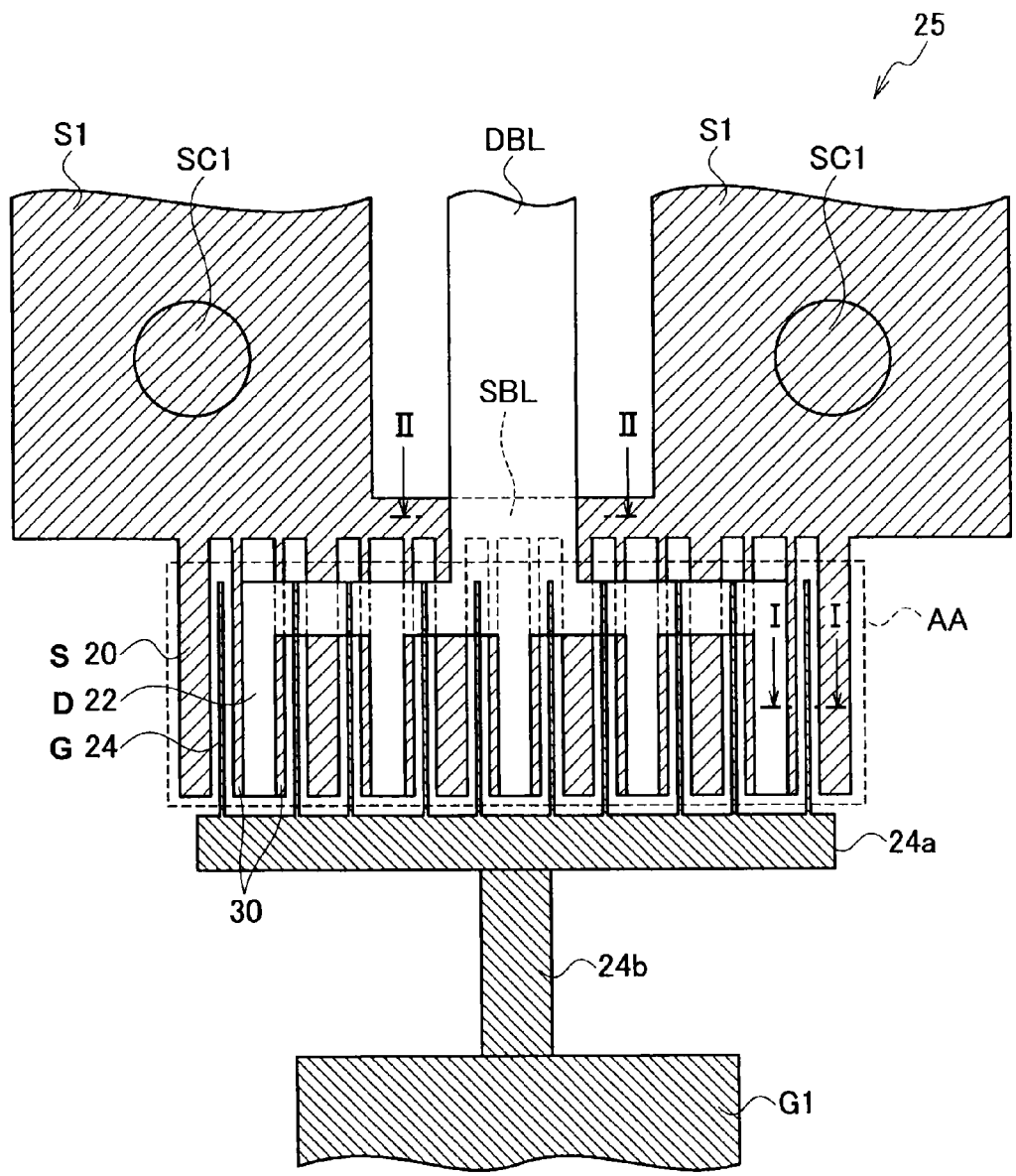
FIG. 2 is an enlarged diagram of the schematic plane pattern structure of FIG. 1.
Figure 3:
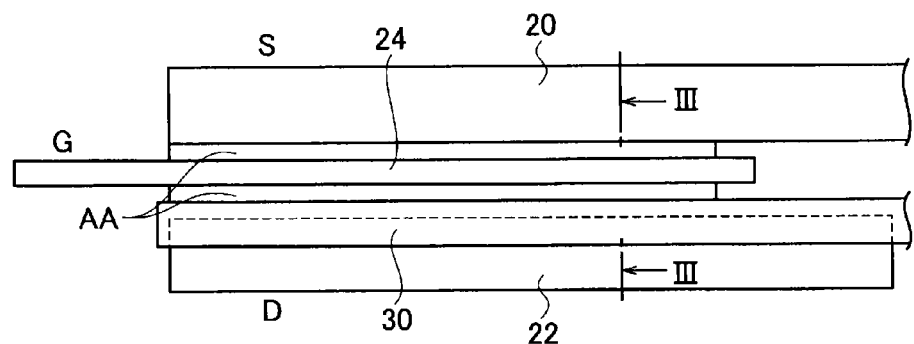
FIG. 3 shows a schematic plane pattern structure of a unit transistor portion in the semiconductor device concerning the first embodiment.
Figure 4:
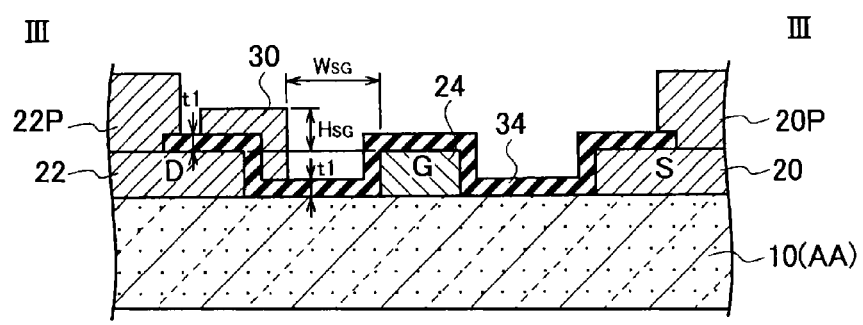
FIG. 4 shows a schematic cross section taken along a III-III line of FIG. 3.

A schematic plane pattern structure of a semiconductor device 25 concerning a first embodiment is shown in FIG. 1. An enlarged diagram of a schematic plane pattern structure of FIG. 1 is shown in FIG. 2. In the semiconductor device 25 concerning the first embodiment, the schematic plane pattern structure of a unit transistor portion is shown in FIG. 3, and a schematic cross section taken along a III-III line of FIG. 3 is shown in FIG. 4. Also in FIG. 1 and FIG. 2, a shield plate electrode 30 as shown in FIG. 3 is arranged at each unit transistor portion. A schematic cross section taken along a I-I line of FIG. 2 is shown in FIG. 7 to FIG. 10. In FIG. 7 to FIG. 10, the shield plate electrode 30 is shown in each drawing.

As shown in FIG. 1 to FIG. 6, the semiconductor device 25 concerning the first embodiment is provided with a substrate 10, a gate electrode G, a source electrode S, a drain electrode D, an insulating layer 34, shield plate electrodes 30, a gate terminal electrode G1, source terminal electrodes S1, and a drain terminal electrode D1. The gate electrode G is arranged on a first surface of the substrate 10, and has a plurality of gate finger electrodes 24. The source electrode S is arranged on the first surface of the substrate 10, and has a plurality of source finger electrodes 20. The source finger electrode 20 is close to the gate finger electrode 24. The drain electrode D is arranged on the first surface of the substrate 10, and has a plurality of drain finger electrodes 22. The drain finger electrode 22 faces the source finger electrode 20 via the gate finger electrode 24. In following explanations, the gate finger electrode 24 may be simply called a gate electrode 24, and the source finger electrode 20 may be simply called a source electrode 20, and the drain finger electrode 22 may be simply called a drain electrode 22.

As shown in FIG. 4, the insulating layer 34 is arranged so as to cover the gate electrode 24, the substrate 10 between the gate electrode 24 and the source electrode 20, the substrate 10 between the gate electrode 24 and the drain electrode 22, at least a part of the source electrode 20, and at least a part of the drain electrode 22.

As shown in FIG. 4, the shield plate electrode 30 is arranged over the first surface of the substrate 10 between the gate electrode 24 and the drain electrode 22, and the drain electrode 22 via the insulating layer 34, is short-circuited to the source terminal electrode S1, and shields electrically the gate electrode 24 and the drain electrode 22 from each other.

The gate terminal electrode G1, the source terminal electrodes S1 and S1, and the drain terminal electrode D1 are arranged on the first surface of the substrate 10.

A plurality of the gate finger electrodes 24 are bundled and are connected to the gate terminal electrode G1. A plurality of the source finger electrodes 20 are bundled and are connected to the source terminal electrodes S1 and S1. A plurality of the drain finger electrodes 22 are bundled and are connected to the drain terminal electrode D1.

Here, as shown in FIG. 1 and FIG. 2, the source terminal electrodes S1 and S1 are arranged between the gate terminal electrode G1 and the drain terminal electrode D1, and shield plate electrodes 30 are connected to the source terminal electrodes S1 and S1.

The source terminal electrodes S1 and S1 are arranged between an active region AA and the drain terminal electrode D1. Here, the active region AA corresponds to an active current conduction region of the substrate between the source electrode 20 and the drain electrode 22. The active region AA also includes portions of the substrate 10 under the gate electrode 24, the source electrode 20 and the drain electrode 22. Furthermore, the active region AA also includes a region of the substrate 10 between the gate electrode 24 and the source electrode 20 and a region of the substrate 10 between the gate electrode 24 and the drain electrode 22. That is, the source terminal electrodes S1 and S1 are arranged between the gate electrode 24 and the drain terminal electrode D1.

And, the semiconductor device 25 concerning the first embodiment is provided with a source bus line SBL which connects the source electrodes 20 and the source terminal electrodes S1, S1, and a drain bus line DBL which connects the drain electrode 22 and the drain terminal electrode D1 as shown in FIG. 2. The source bus line SBL bundles a plurality of the source finger electrodes 20. The drain bus line DBL bundles a plurality of the drain finger electrodes 22.

Figure 5:
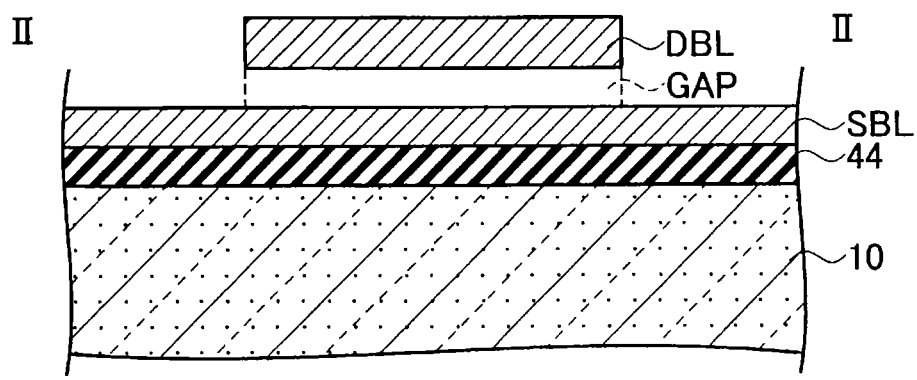
FIG. 5 shows a schematic cross section taken along a II-II line of FIG. 2.
Figure 6:
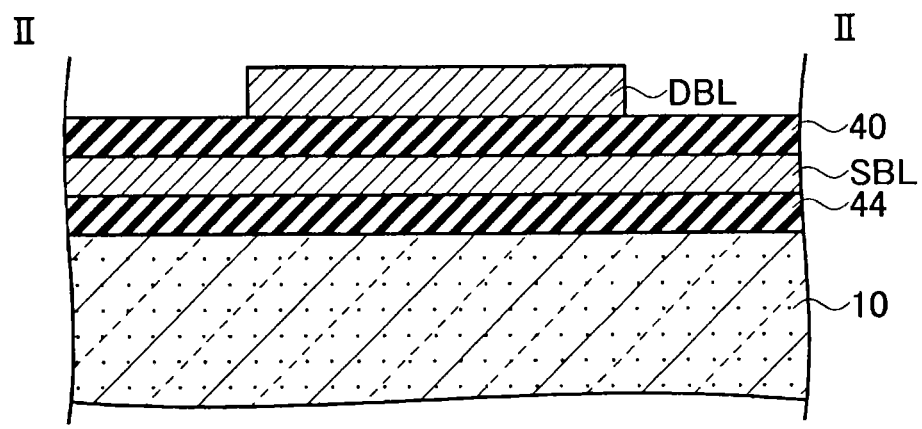
FIG. 6 shows another schematic cross section taken along the II-II line of FIG. 2.

The schematic cross section taken along the II-II line of FIG. 2 is shown in FIG. 5, and another schematic cross section taken along the II-II line of FIG. 2 is shown in FIG. 6.

The drain bus line DBL may be arranged over the source bus line SBL via an air gap, as shown in FIG. 2 and FIG. 5.

The drain bus line DBL may be arranged over the source bus line SBL via an overlay insulating layer 40, as shown in FIG. 2 and FIG. 6.

Here, the source bus line SBL is arranged on a pad insulating film 44 arranged on the substrate 10, as shown in FIG. 5 and FIG. 6.

In addition, the shield plate electrode 30 is separated from the gate electrode 24 by at least only a distance WSG longer than a thickness t1 of the insulating layer, as shown in FIG. 4. By constituting thus, effect of electric shield between a drain and a gate is increased, and a capacitance Cgd between the gate and the drain is reduced. When the shield plate electrode 30 is separated from the gate electrode 24, an increase in a capacitance Cgs between the gate and a source can be suppressed. Here, the shield plate electrode 30 should be separated from the gate electrode 24 by at least only the distance WSG longer than the thickness t1 of the insulating layer. Here, what is necessary is just WSG>0.

And, the shield plate electrode 30 covers at least a part of an upper part of the drain electrode 22 via the insulating layer 34, as shown in FIG. 3 and FIG. 4.

As for the effect of the electric shield between the gate and the drain by the shield plate electrode 30, the thinner the thickness t1 of the insulating layer 34 is, the grater the effect is. In the case where the thickness t1 of the insulating layer 34 is relatively thick, the number of the lines of electric force which run the inside of the insulating layer 34 between the gate electrode 24 and the drain electrode 22 increases, and the effect of the electric shield between the gate electrode 24 and the drain electrode 22 is reduced. On the other hand, in the case where the thickness t1 of the insulating layer 34 is relatively thin, the number of the lines of electric force which run the inside of the insulating layer 34 between the gate electrode 24 and the drain electrode 22 decreases correspondingly to a thinned part of the insulating layer 34, and the effect of the electric shield between the gate electrode 24 and the drain electrode 22 increases.

As shown in FIG. 4, a drain pad electrode 22P may be arranged on the drain electrode 22, and a source pad electrode 20P may be arranged on the source electrode 20. A resistance ingredient of the drain electrode D and the source electrode S which have finger structure, respectively can be reduced by the drain pad electrode 22P and the source pad electrode 20P.

In addition, as shown in FIG. 4, in the semiconductor device 25 concerning the first embodiment, an upper end of the shield plate electrode 30 measured from the first surface of the substrate 10 is higher than an upper end of the gate electrode 24 by only a height HSG. By constituting thus, the effect of the electric shield between the drain and the gate can be increased.

In the semiconductor device 25 concerning the first embodiment, the source terminal electrodes S1, S1 are arranged between the active region AA and the drain terminal electrode D1, and the shield plate electrode 30 is connected to the source terminal electrode S1. Under the source terminal electrode S1, a VIA hole SC1 is formed in the substrate 10. The source terminal electrode S1 is connected to the VIA hole SC1. A ground electrode (not shown) is arranged on a second surface opposite to the first surface of the substrate 10 and the source terminal electrodes S1, S1 is connected to ground electrode via the VIA holes SC1.

In the semiconductor device 25 concerning the first embodiment, by arranging the shield plate electrode 30 which is short-circuited to the source electrode S1 near the drain electrode 22, the drain and the gate are electrically shielded from each other, the capacitance Cgd between the gate and the drain is reduced, and the increase in the capacitance Cgs between the gate and the source can be suppressed. Accordingly, concentration of electric field between the gate and the drain can be relaxed without degrading a high-frequency characteristic.

The capacitance Cgd between the gate and the drain can be reduced in the semiconductor device 25 concerning the first embodiment. As a result, S parameter S12 can be reduced and a semiconductor device of high gain can be obtained.

In addition, as shown in FIG. 1 and FIG. 2, the semiconductor device 25 concerning the first embodiment includes: a semi-insulating substrate 10; the gate electrode G which is arranged on the first surface of the semi-insulating substrate 10 and has a plurality of the gate finger electrodes 24; the source electrode S which is arranged on the first surface of the semi-insulating substrate 10 and has a plurality of the source finger electrodes 20; the drain electrode D which is arranged on the first surface of the semi-insulating substrate 10 and has a plurality of the finger electrodes 22; the gate terminal electrode G1 which is arranged on the first surface of the semi-insulating substrate 10 and is connects to a plurality of the gate finger electrodes 24; the source terminal electrodes S1, S1 which are arranged on the first surface of the semi-insulating substrate 10 and are connected to a plurality of the source finger electrodes 20; the drain terminal electrode D1 which is arranged on the first surface of the semi-insulating substrate 10 and is connected to a plurality of the drain finger electrodes 22; the VIA hole SC1 which is arranged under the source terminal electrode S1 and is formed in the substrate; and the ground electrode (not shown) which is arranged on the second surface opposite to the first surface of the semi-insulating substrate 10 and is connected to the source terminal electrodes S1, S1 via the VIA holes SC1.

A plurality of the gate electrodes 24 are connected to a gate bus line 24a, and the gate bus line 24a is connected to the gate terminal electrode G1 via a gate bus line 24b. The gate bus line 24a bundles a plurality of the gate finger electrodes 24.

An input bonding wire is connected to the gate terminal electrode G1, and an output bonding wire is connected to the drain terminal electrode D1.

The VIA hole SC1 includes a barrier metal layer (not shown) which is formed on an inner wall of a hole, and a filling metal layer (not shown) which is formed on the barrier metal layer and with which the hole is filled up. The source terminal electrodes S1 and S1 are connected to the ground electrode (not shown) via the VIA hole SC1.

The semi-insulating substrate 10 is any one of a GaAs substrate, an SiC substrate, a GaN substrate, a substrate including the SiC substrate on which a GaN epitaxial layer is formed, a substrate including the SiC substrate on which a hetero-junction epitaxial layer which consists of GaN/AlGaN is formed, a sapphire substrate, and a diamond substrate.

In addition, in the semiconductor device 25 concerning the first embodiment, the semiconductor device is provided with any one of a GaAs system HEMT, a GaAsMESFET and a GaN system HEMT. That is, in semiconductor device 25 concerning first embodiment, a semiconducting material suitable for high-frequency operations, such as GaN and GaAs, is used especially for the semiconductor device.

Construction of FET Cell

Constructional Example 1

Figure 7:
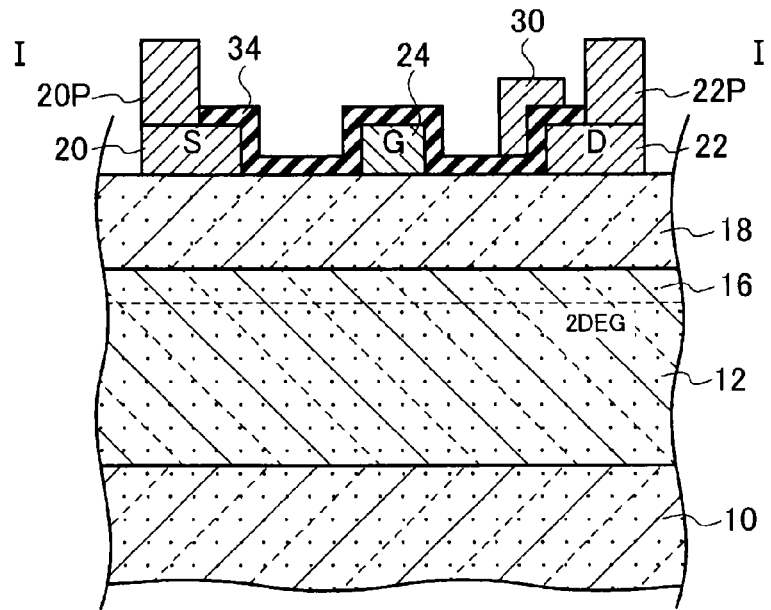
FIG. 7 shows a schematic cross section taken along a I-I line of FIG. 2 in constructional example 1 of an FET cell.

FIG. 7 shows the constructional example 1 of an FET cell by a schematic cross section taken along the I-I line of FIG. 2. The FET cell includes: a substrate 10; an epitaxial layer 12 which is arranged on the substrate 10; an electron supplying layer 18 which is arranged on the epitaxial layer 12; a source electrode 20, a gate electrode 24, and a drain electrode 22 which are arranged on the electron supplying layer 18; an insulating layer 34 which is arranged so as to cover the gate electrode 24, the electron supplying layer 18 between the gate electrode 24 and the source electrode 20, the electron supplying layer 18 between the gate electrode 24 and the drain electrode 22, at least a part of the source electrode 20, and at least a part of the drain electrode 22; and a shield plate electrode 30 which is arranged via the insulating layer 34 over the drain electrode 22 and the electron supplying layer 18 between the gate electrode 24 and the drain electrode 22, is short-circuited to a source terminal electrode S1, and shields electrically the gate electrode 24 and the drain electrode 22 from each other. A two-dimensional electron gas (2DEG) layer 16 is formed in an interface of the epitaxial layer 12 and the electron supplying layer 18. A high-electron mobility transistor (HEMT) is shown in FIG. 7.

As a specific material, in the case of a GaAs system HEMT, the substrate 10 is formed by a GaAs substrate, the epitaxial layer 12 is formed by a GaAs layer, and the electron supplying layer 18 is formed by an aluminum gallium arsenide layer ($Al_yGa_{1-y}As$) ($0.1 \leq y \leq 1$), for example. In the case of a GaN system HEMT, the substrate 10 is formed by a GaN substrate or an SiC substrate, the epitaxial layer 12 is formed by a GaN layer, and the electron supplying layer 18 is formed by the aluminum gallium nitride layer ($Al_xGa_{1-x}N$) ($0.1 \leq x \leq 1$), for example. In the constructional example 1 shown in FIG. 7, the substrate 10, the epitaxial layer 12 and the electron supplying layer 18 correspond to the substrate 10 in FIG. 4 as a whole.

As shown in FIG. 7, a drain pad electrode 22P may be arranged on the drain electrode 22, and a source pad electrode 20P may be arranged on the source electrode 20. The resistance ingredient of the drain electrode D and the source electrode S which have finger structures, respectively, can be reduced by the drain pad electrode 22P and the source pad electrode 20P.

Constructional Example 2

Figure 8:
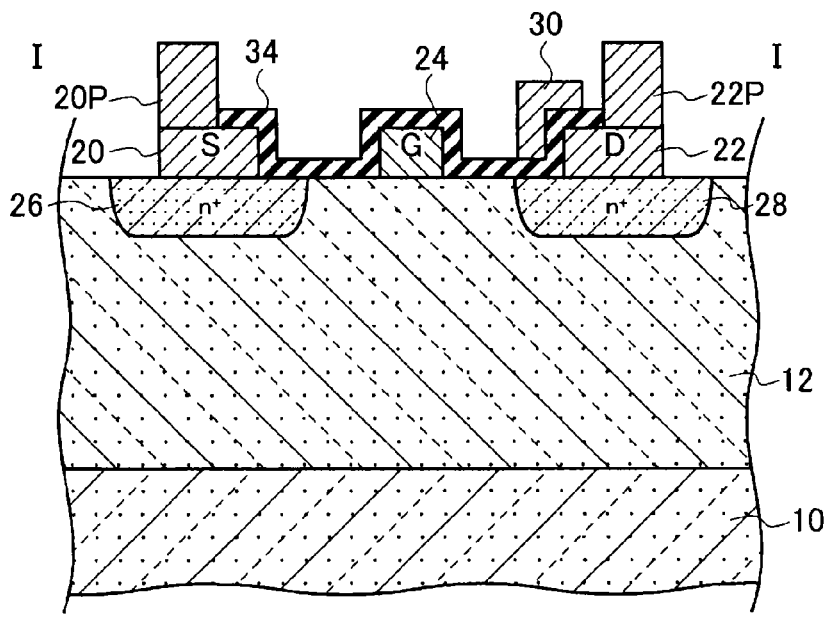
FIG. 8 shows a schematic cross section taken along the I-I line of FIG. 2 in constructional example 2 of an FET cell.

FIG. 8 shows the constructional example 2 of an FET cell by a schematic cross section taken along the I-I line of FIG. 2. An FET cell includes: a substrate 10; an epitaxial layer 12 which is arranged on the substrate 10; a source region 26 and a drain region 28 which are arranged in the epitaxial layer 12; a source electrode 20 which is arranged on the source region 26; a gate electrode 24 which is arranged on an epitaxial layer 12; a drain electrode 22 which is arranged on the drain region 28; an insulating layer 34 which is arranged so as to cover the gate electrode 24, the epitaxial layer 12 between the gate electrode 24 and the source electrode 20, the epitaxial layer 12 between the gate electrode 24 and the drain electrode 22, at least a part of the source electrode 20, and at least a part of the drain electrode 22; and a shield plate electrode 30 which is arranged via the insulating layer 34 over the drain electrode 22 and the epitaxial layer 12 between the gate electrode 24 and the drain electrode 22, is short-circuited to a source terminal electrode S1 and shields electrically the gate electrode 24 and the drain electrode 22 from each other. A schottky contact is formed in an interface of the epitaxial layer 12 and the gate electrode 24. A metal-semiconductor field effect transistor (MESFET) is shown in FIG. 8. For example, in the case of a GaAs MESFET, the substrate 10 is formed by a GaAs substrate, and the epitaxial layer 12 is formed by an epitaxially grown GaAs layer. The source region 26 and the drain region 28 can be formed by ion implantation, such as Si ion etc. In the constructional example 2 shown in FIG. 8, the substrate 10 and the epitaxial layer 12 correspond to the substrate 10 in FIG. 4 as a whole.

As shown in FIG. 8, a drain pad electrode 22P may be arranged on the drain electrode 22, and a source pad electrode 20P may be arranged on the source electrode 20. The resistance ingredient of the drain electrode D and the source electrode S which have finger structures, respectively, can be reduced by the drain pad electrode 22P and the source pad electrode 20P.

Constructional Example 3

Figure 9:
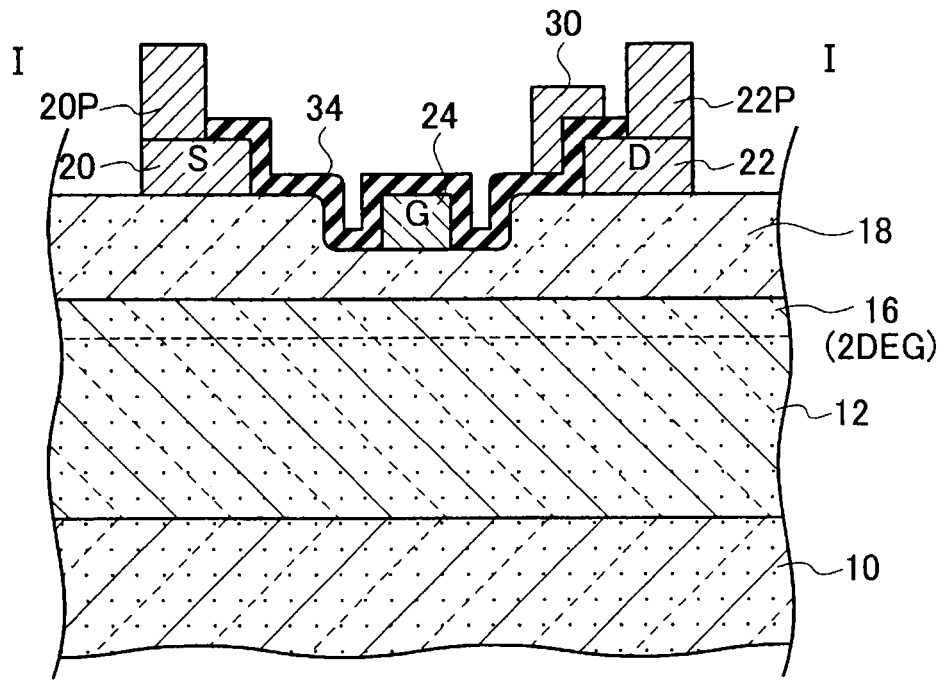
FIG. 9 shows a schematic cross section taken along the I-I line of FIG. 2 in constructional example 3 of an FET cell.

FIG. 9 shows a constructional example 3 of an FET cell by a schematic cross section taken along the I-I line of FIG. 2. An FET cell includes: a substrate 10; an epitaxial layer 12 which is arranged on the substrate 10; an electron supplying layer 18 which is arranged on the epitaxial layer 12; a source electrode 20 and a drain electrode 22 which are arranged on the electron supplying layer 18; a gate electrode 24 which is arranged on a recess part of the electron supplying layer 18; an insulating layer 34 which is arranged so as to cover the gate electrode 24, the electron supplying layer 18 between the gate electrode 24 and the source electrode 20, the electron supplying layer 18 between the gate electrode 24 and the drain electrode 22, at least a part of the source electrode 20, and at least a part of the drain electrode 22; and a shield plate electrode 30 which is arranged via the insulating layer 34 over the drain electrode 22 and the electron supplying layer 18 between the gate electrode 24 and the drain electrode 22, is short-circuited to a source terminal electrode S1, and shields electrically the gate electrode 24 and the drain electrode 22 from each other. A 2DEG layer 16 is formed in an interface of the epitaxial layer 12 and the electron supplying layer 18. An HEMT is shown in FIG. 9.

As a specific material, in the case of a GaAs system HEMT, the substrate 10 is formed by a GaAs substrate, the epitaxial layer 12 is formed by a GaAs layer, and the electron supplying layer 18 is formed by an aluminum gallium arsenide layer ($Al_yGa_{1-y}As$) ($0.1 \leq y \leq 1$), for example. In addition, in the case of a GaAs system HEMT, an active layer may be formed by ion implantation of Si ion etc. in the electron supplying layer 18 directly under the gate electrode 24.

In the case of a GaN system HEMT, the substrate 10 is formed by a GaN substrate or an SiC substrate, the epitaxial layer 12 is formed by a GaN layer, and the electron supplying layer 18 is formed by the aluminum gallium nitride layer ($Al_xGa_{1-x}N$) ($0.1 \leq x \leq 1$), for example. In the constructional example 3 shown in FIG. 9, the substrate 10, the epitaxial layer 12 and the electron supplying layer 18 correspond to the substrate 10 in FIG. 4 as a whole.

As shown in FIG. 9, a drain pad electrode 22P may be arranged on the drain electrode 22, and a source pad electrode 20P may be arranged on the source electrode 20. The resistance ingredient of the drain electrode D and the source electrode S which have finger structure, respectively, can be reduced by the drain pad electrode 22P and the source pad electrode 20P.

Constructional Example 4

Figure 10:
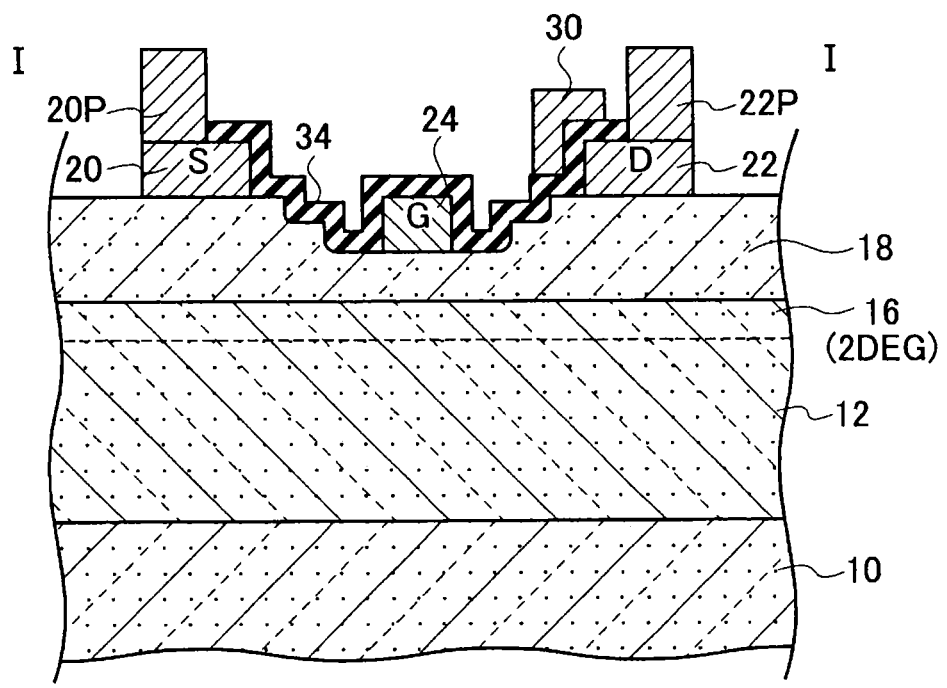
FIG. 10 shows a schematic cross section taken along the I-I line of FIG. 2 in constructional example 4 of an FET cell.

FIG. 10 shows the constructional example 4 of an FET cell by a schematic cross section taken along the I-I line of FIG. 2. An FET cell includes: a substrate 10; an epitaxial layer 12 which is arranged on the substrate 10; an electron supplying layer 18 which is arranged on the epitaxial layer 12; a source electrode 20 and a drain electrode 22 which are arranged on the electron supplying layer 18; a gate electrode 24 which is arranged on a two-step recess part of the electronic supplying layer 18; an insulating layer 34 which is arranged so as to cover the gate electrode 24, the electronic supplying layer 18 between the gate electrode 24 and the source electrode 20, the electronic supplying layer 18 between the gate electrode 24 and the drain electrode 22, at least a part of the source electrode 20, and at least a part of the drain electrode 22; and a shield plate electrode 30 which is arranged via the insulating layer 34 over the drain electrode 22 and the electronic supplying layer 18 between the gate electrode 24 and the drain electrode 22, is short-circuited to a source terminal electrode S1, and shields electrically the gate electrode 24 and the drain electrode 22 from each other. A 2DEG layer 16 is formed in an interface of the epitaxial layer 12 and the electron supplying layer 18. An HEMT is shown in FIG. 10.

As a specific material, in the case of a GaAs system HEMT, the substrate 10 is formed by a GaAs substrate, the epitaxial layer 12 is formed by a GaAs layer, and the electron supplying layer 18 is formed by an aluminum gallium arsenide layer ($Al_yGa_{1-y}As$) ($0.1 \leq y \leq 1$), for example. In addition, in the case of a GaAs system HEMT, an active layer may be formed by ion implantation of Si ion etc. in the electron supplying layer 18 directly under the gate electrode 24.

In the case of a GaN system HEMT, the substrate 10 is formed by a GaN substrate or an SiC substrate, the epitaxial layer 12 is formed by a GaN layer, and the electron supplying layer 18 is formed by the aluminum gallium nitride layer ($Al_xGa_{1-x}N$) ($0.1 \leq x \leq 1$), for example. In the constructional example 4 shown in FIG. 10, the substrate 10, the epitaxial layer 12 and the electron supplying layer 18 correspond to the substrate 10 in FIG. 4 as a whole.

In addition, in the semiconductor device 25 concerning the first embodiment, as for the gate electrode 24, a cross section shape of the gate electrode 24 in a cross section in a direction of a channel between the source and the drain may be formed in T type so that the electric field in the circumference of the gate electrode 24 may be relaxed.

As shown in FIG. 10, a drain pad electrode 22P may be arranged on the drain electrode 22, and a source pad electrode 20P may be arranged on the source electrode 20. The resistance ingredient of the drain electrode D and the source electrode S which have finger structures, respectively, can be reduced by the drain pad electrode 22P and the source pad electrode 20P.

(Modification 1)

Figure 11:
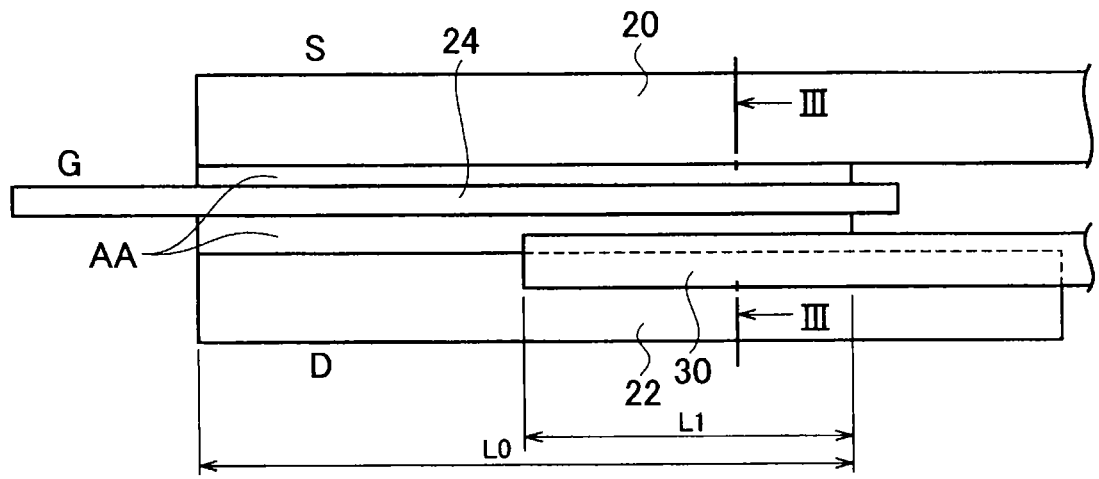
FIG. 11 shows a schematic plane pattern structure of a high-frequency semiconductor device concerning a modification 1 of the first embodiment.

A schematic plane pattern structure of the semiconductor device concerning a modification 1 of the first embodiment is shown in FIG. 11. In the semiconductor device concerning the modification 1 of the first embodiment, a shield plate electrode 30 overlaps with a part of a drain electrode 22. That is, a length L0 of the drain electrode 22 which is in contact with an active region AA, and a length L1 of the shield plate electrode 30 which is arranged on the active region AA, are in a relation of L1<L0.

In FIG. 11, a schematic cross section taken along a III-III line is the same as that of FIG. 4.

In the semiconductor device 25 concerning the modification 1 of the first embodiment, source terminal electrodes S1, S1 are arranged between the active region AA and a drain terminal electrode D1, and a shield plate electrode 30 is connected to the source terminal electrode S1. Under the source terminal electrode S1, a VIA hole SC1 is formed in the substrate 10. The source terminal electrode S1 is connected to the VIA hole SC1.

In the semiconductor device concerning the modification 1 of the first embodiment, since the shield plate electrode 30 overlaps with a part of the drain electrode 22, the shield plate electrode 30 shields the drain and the gate from each other electrically, reduces a capacitance Cgd between the gate and the drain, and can suppress an increase in a capacitance Cgs between the gate and the source. As a result, according to the modification 1 of the first embodiment, a semiconductor device of high gain can be obtained. Other composition is the same as that of the first embodiment.

(Modification 2)

Figure 12:
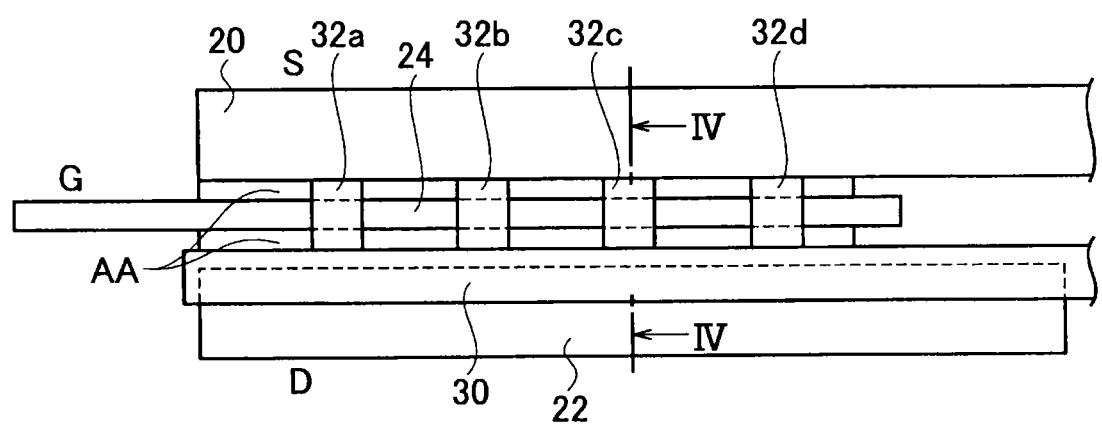
FIG. 12 shows a schematic plane pattern structure of a high-frequency semiconductor device concerning a modification 2 of the first embodiment.

A schematic plane pattern structure of a high-frequency semiconductor device concerning a modification 2 of the first embodiment is shown in FIG. 12. A schematic cross section taken along the IV-IV line of FIG. 12 is shown in FIG. 13, and another schematic cross section taken along the IV-IV line of FIG. 12 is shown in FIG. 14.

In the semiconductor device 25 concerning the modification 2 of the first embodiment, source terminal electrodes S1, S1 are arranged between an active region AA and a drain terminal electrode D1, and a shield plate electrode 30 is connected to a source terminal electrode S1. Under the source terminal electrode S1, a VIA hole SC1 is formed in the substrate 10. The source terminal electrode S1 is connected to the VIA hole SC1.

The semiconductor device 25 concerning the modification 2 of the first embodiment is provided with shield plate short circuit lines 32a, 32b, 32c and 32d. The shield plate short circuit line 32a, 32b, 32c and 32d overlap with a gate electrode 24, and short-circuits a source electrode 20 and a shield plate electrode 30.

Figure 13:
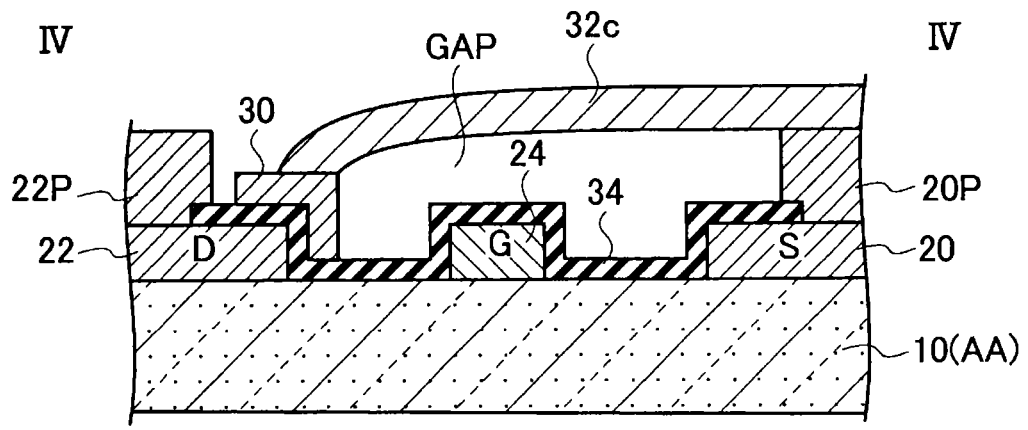
FIG. 13 shows a schematic cross section taken along a IV-IV line of FIG. 12.
Figure 14:
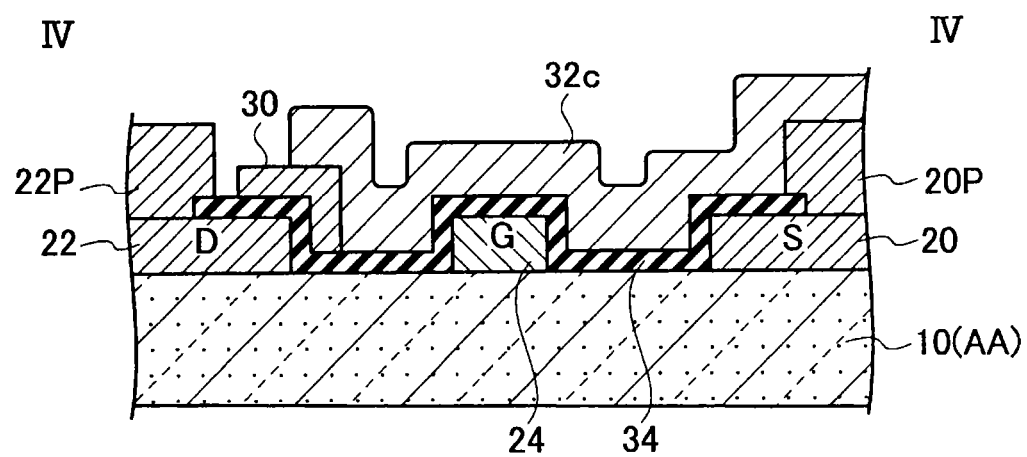
FIG. 14 shows another schematic cross section taken along the IV-IV line of FIG. 12.

In the example of FIG. 13, each of the shield plate short circuit lines 32a, 32b, 32c and 32d is arranged over the gate electrode 24 via an air gap GAP. In the example of FIG. 14, each of the shield plate short circuit lines 32a, 32b, 32c and 32d is arranged over the gate electrode 24 via an insulating layer 34.

In the semiconductor device concerning the modification 2 of the first embodiment, since the shield plate short circuit lines 32a, 32b, 32c and 32d overlap with the gate electrode 24 via the air gap GAP or the insulating layer 34, a line which short-circuits the source electrode 20 and the shield plate electrode 30 can be shortened.

For this reason, inductance of a parasitic inductor connected to a source of the FET cell can be reduced, and feedback impedance of each FET cell can be reduced.

In the semiconductor device concerning the modification 2 of the first embodiment, the shield plate short circuit lines 32a, 32b, 32c and 32d shield electrically the drain and the gate from each other, reduces a capacitance Cgd between the gate and the drain, and can suppress an increase in a capacitance Cgs between the gate and the source. Accordingly, concentration of electric field between the gate and the drain can be relaxed without degrading a high-frequency characteristic.

The semiconductor device 25 concerning the modification 2 of the first embodiment can reduce the capacitance Cgd between the gate and the drain. For this reason, S parameter S12 can be reduced and a semiconductor device of high gain can be obtained. Other composition is the same as that of the first embodiment.

(Modification 3)

Figure 15:
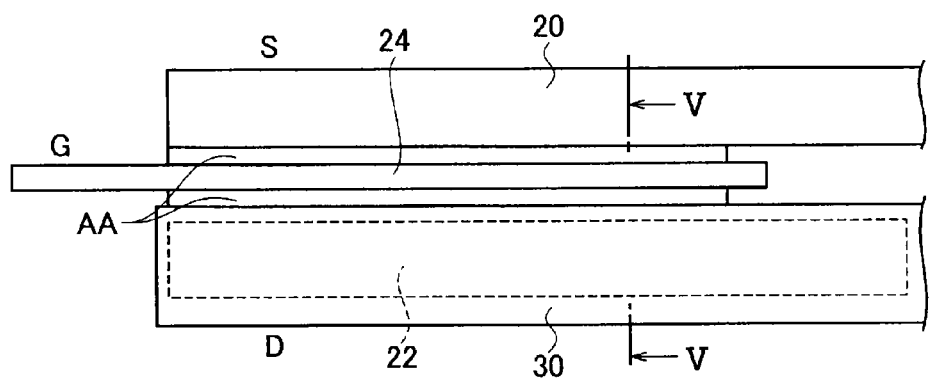
FIG. 15 shows a schematic plane pattern structure of a unit transistor portion of a semiconductor device concerning a modification 3 of the first embodiment.
Figure 16:
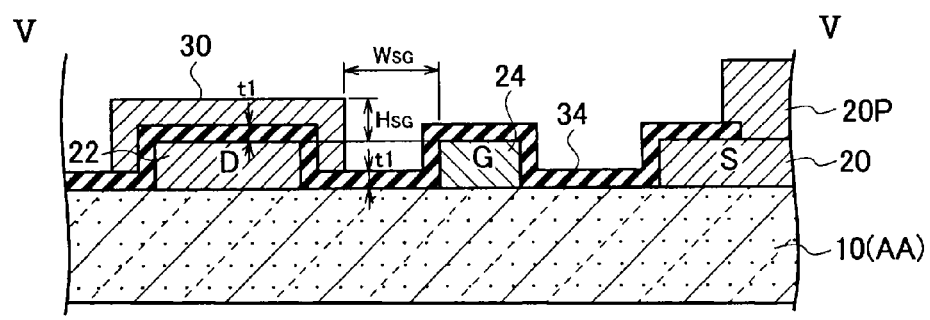
FIG. 16 shows a schematic cross section taken along a V-V line of FIG. 15.

A schematic plane pattern structure of a unit transistor portion of a semiconductor device concerning a modification 3 of the first embodiment is shown in FIG. 15, and a schematic cross section taken along the V-V line of FIG. 15 is shown in FIG. 16.

In the semiconductor device 25 concerning the modification 3 of the first embodiment, as shown in FIG. 16, a shield plate electrode 30 is arranged over a drain electrode 22 and a first surface of a substrate 10 between a gate electrode 24 and a drain electrode 22 via an insulating layer 34, is connected to a source terminal electrode S1, and shields electrically the gate electrode 24 and the drain electrode 22 from each other.

In the semiconductor device 25 concerning the modification 3 of the first embodiment, since the shield plate electrode 30 is arranged via a insulating layer 34 over the drain electrode 22 as shown in FIG. 16, compared with the first embodiment and the modifications 1 and 2 thereof, effect of electric shield between the gate electrode 24 and the drain electrode 22 is increased.

In the semiconductor device 25 concerning the modification 3 of the first embodiment, the source terminal electrodes S1, S1 are arranged between an active region AA and a drain terminal electrode D1, and the shield plate electrode 30 is connected to the source terminal electrodes S1, S1. Under the source terminal electrode S11, a VIA hole SC1 is formed in the substrate 10. The source terminal electrode S1 is connected to the VIA hole SC1.

In the semiconductor device 25 concerning the modification 3 of the first embodiment, by arranging the shield plate electrode 30 which is connected to the source terminal electrode S1 near the drain electrode 22, a drain and a gate are shielded electrically from each other, a capacitance Cgd between the gate and the drain is reduced, an increase in a capacitance Cgs between the gate and a source can be suppressed. Accordingly, concentration of electric field between the gate and the drain can be relaxed without degrading a high-frequency characteristic.

The semiconductor device 25 concerning the modification 3 of the first embodiment can reduce the capacitance Cgd between the gate and the drain. As a result, S parameter S12 can be reduced and a semiconductor device of high gain can be obtained. Other composition is the same as that of the first embodiment.

(Modification 4)

Figure 17:
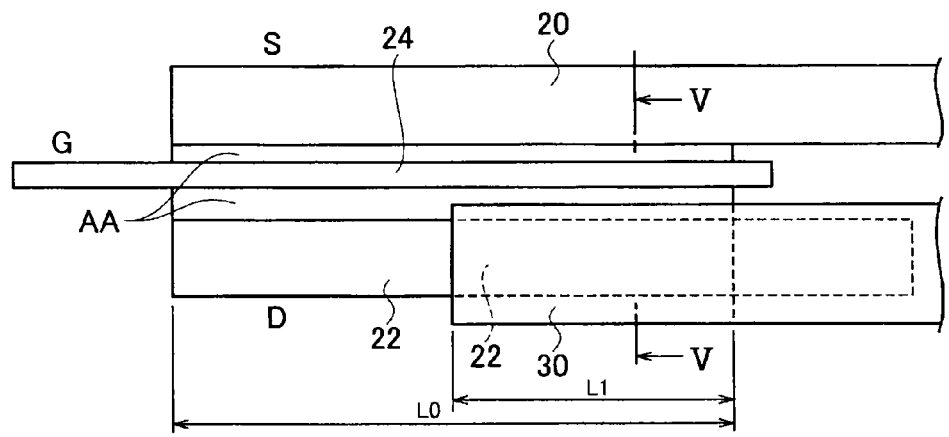
FIG. 17 shows a schematic plane pattern structure of a high-frequency semiconductor device concerning a modification 4 of the first embodiment.

A schematic plane pattern structure of a semiconductor device concerning a modification 4 of the first embodiment is shown in FIG. 17. In the semiconductor device concerning the modification 4 of the first embodiment, a shield plate electrode 30 overlaps with a part of a drain electrode 22. That is, a length L0 of the drain electrode 22 which is in contact with an active region AA, and a length L1 of the shield plate electrode 30 which is arranged on the active region AA, are in a relation of L1<L0.

In FIG. 17, a schematic cross section taken along a V-V line is the same as that of FIG. 16.

In the semiconductor device 25 concerning the modification 4 of the first embodiment, source terminal electrodes S1, S1 are arranged between the active region AA and a drain terminal electrode D1, and a shield plate electrode 30 is connected to the source terminal electrode S1. Under the source terminal electrode S1, a VIA hole SC1 is formed in a substrate 10. The source terminal electrode S1 is connected to the VIA hole SC1.

In the semiconductor device concerning the modification 4 of the first embodiment, since the shield plate electrode 30 overlaps with a part of the drain electrode 22, a drain and a gate are shielded electrically from each other, a capacitance Cgd between the gate and the drain is reduced, and an increase in a capacitance Cgs between the gate and q source can be suppressed. As a result, according to the modification 4 of the first embodiment, a semiconductor device of high gain can be obtained. Other composition is the same as that of the first embodiment.

(Modification 5)

Figure 18:
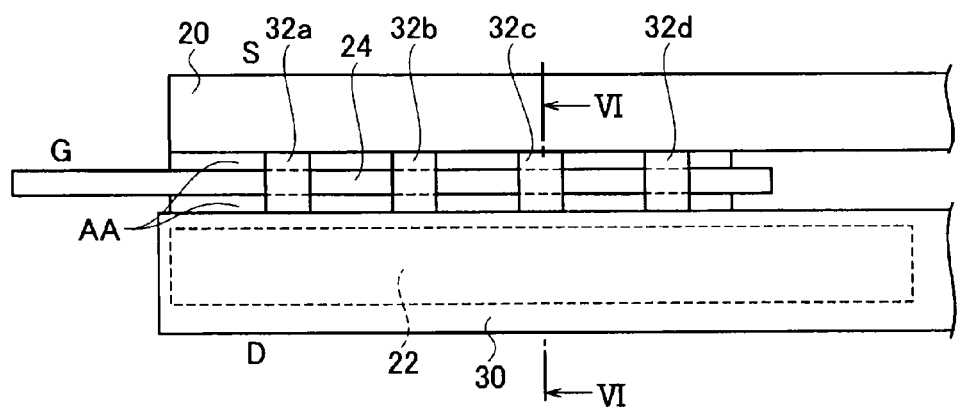
FIG. 18 shows a schematic plane pattern structure of a high-frequency semiconductor device concerning a modification 5 of the first embodiment.

A schematic plane pattern structure of a high-frequency semiconductor device concerning a modification 5 of the first embodiment is shown in FIG. 18. A schematic cross section taken along a VI-VI line of FIG. 18 is shown in FIG. 19, and another schematic cross section taken along the VI-VI line of FIG. 18 is shown in FIG. 20.

In the semiconductor device 25 concerning the modification 5 of the first embodiment, source terminal electrodes S1, S1 are arranged between an active region AA and a drain terminal electrode D1, and a shield plate electrode 30 is connected to the source terminal electrode S1. Under the source terminal electrode S1, a VIA hole SC1 is formed in a substrate 10. The source terminal electrode S1 is connected to the VIA hole SC1.

The semiconductor device 25 concerning the modification 5 of the first embodiment is provided with shield plate short circuit lines 32a, 32b, 32c and 32d. The shield plate short circuit line 32a, 32b, 32c and 32d overlap with a gate electrode 24, and short-circuit a source electrode 20 and the shield plate electrode 30.

Figure 19:
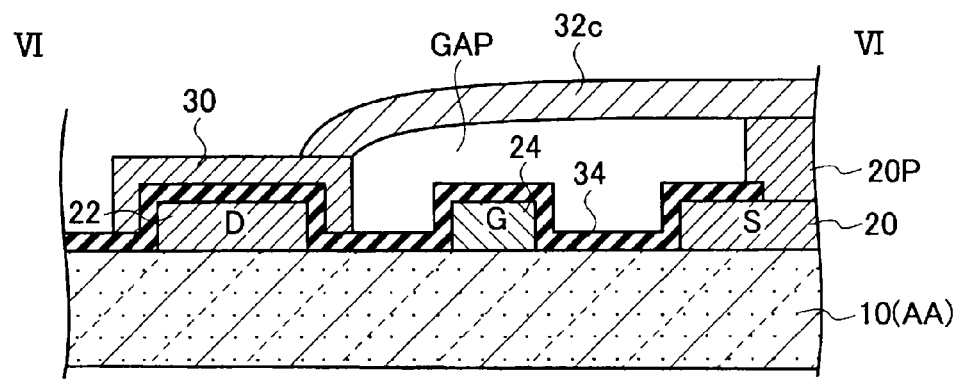
FIG. 19 shows the schematic cross section taken along a VI-VI line of FIG. 18.
Figure 20:
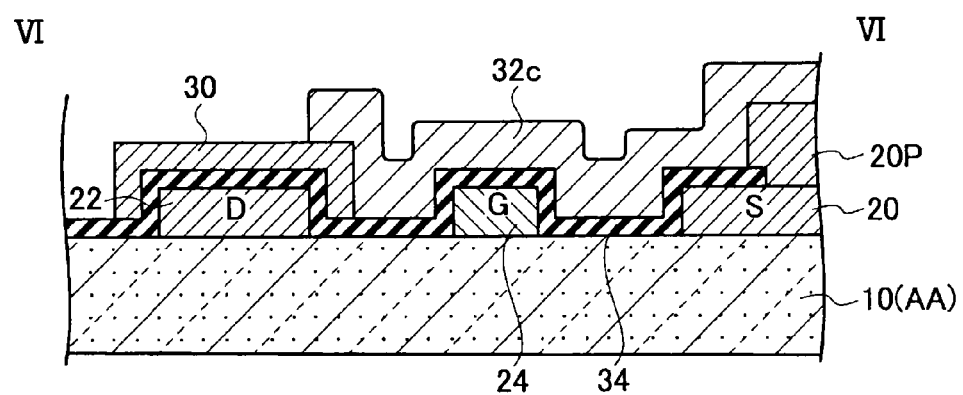
FIG. 20 shows another schematic cross section taken along the VI-VI line of FIG. 18.

In an example of FIG. 19, each of the shield plate short circuit line 32a, 32b, 32c and 32d is arranged via an air gap GAP over the gate electrode 24. In the example of FIG. 20, each of the shield plate short circuit lines 32a, 32b, 32c and 32d is arranged via an insulating layer 34 over the gate electrode 24.

In the semiconductor device concerning the modification 5 of the first embodiment, since the shield plate short circuit line 32a, 32b, 32c and 32d overlap with the gate electrode 24 via the air gap GAP or the insulating layer 34, a line which short-circuits the source electrode 20 and the shield plate electrode 30 can be shortened. For this reason, inductance of a parasitic inductor connected to a sauce of the FET cell can be reduced, and feedback impedance of each FET cell can be reduced.

In the semiconductor device concerning the modification 5 of the first embodiment, a drain and a gate are shielded electrically from each other, a capacitance Cgd between the gate and the drain is reduced, an increase in a capacitance Cgs between the gate and the source can be suppressed. Accordingly, concentration of electric field between the gate and the drain can be relaxed without degrading a high-frequency characteristic.

In the semiconductor device 25 concerning the modification 5 of the first embodiment, since the capacitance Cgd between the gate and the drain can be reduced, S parameter S12 can be reduced and a semiconductor device of high gain can be obtained. Other composition is the same as that of the first embodiment.

Second Embodiment

Semiconductor Device

Figure 21:
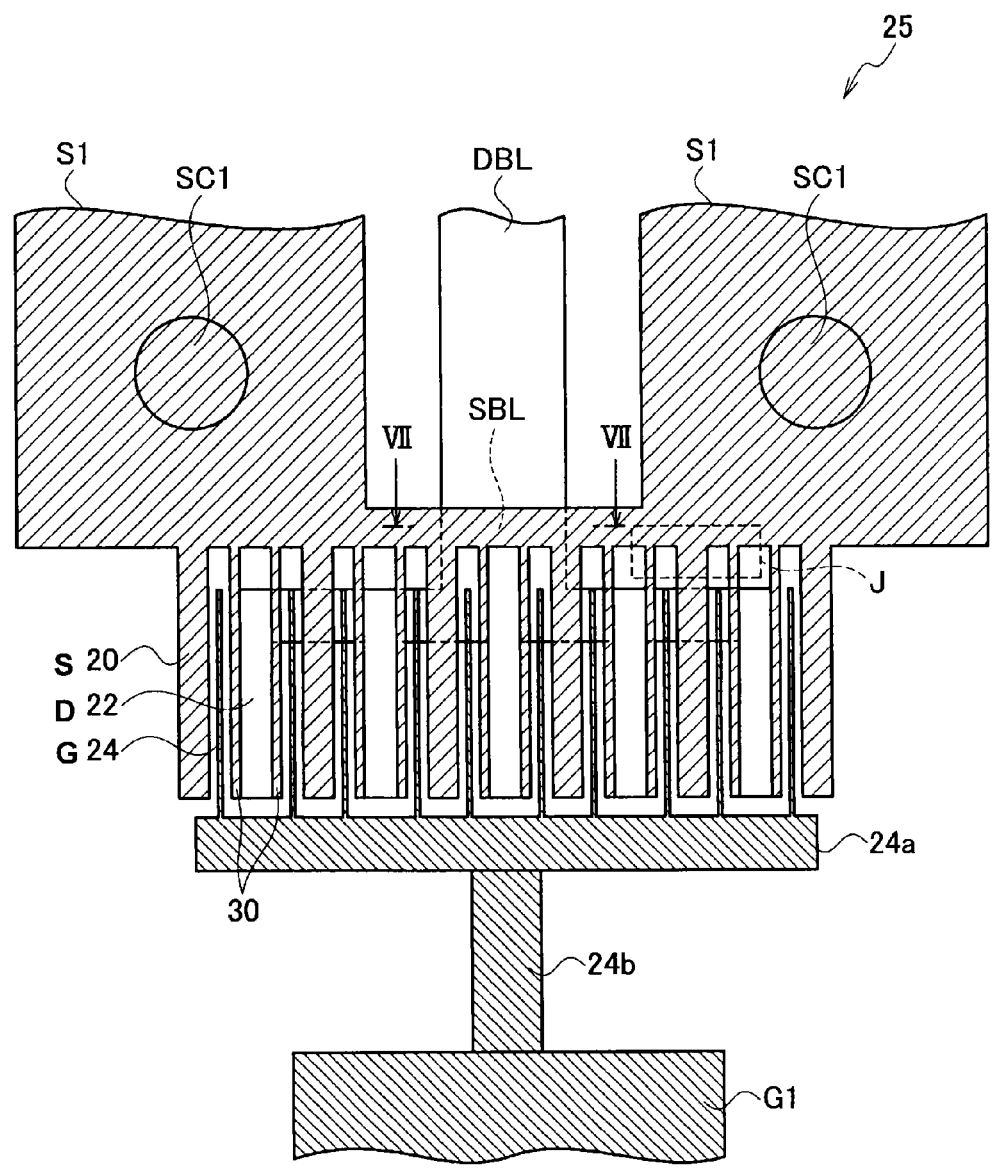
FIG. 21 shows an enlarged schematic plane pattern structure of the semiconductor device concerning a second embodiment.

An enlarged schematic plane pattern structure of a semiconductor device 25 concerning a second embodiment is shown in FIG. 21. The schematic plane pattern structure of the semiconductor device 25 concerning the second embodiment is similarly expressed as FIG. 1. In the semiconductor device 25 concerning the second embodiment, a schematic plane pattern structure of a unit transistor portion is similarly expressed as FIG. 3, and a schematic cross section is similarly expressed as FIG. 4.

The semiconductor device 25 concerning the second embodiment is provided with a substrate 10, a gate electrode 24, a source electrode 20, a drain electrode 22, an insulating layer 34, a shield plate electrode 30, a gate terminal electrode, a source terminal electrode, and a drain terminal electrode as shown in FIG. 21.

The gate electrode G is arranged on a first surface of the substrate 10, and has a plurality of gate finger electrodes 24. The source electrode S is arranged on the first surface of the substrate 10 and has a plurality of source finger electrodes 20. The source finger electrode 20 is close to the gate electrode 24. The drain electrode D is arranged on the first surface of the substrate 10, and has a plurality of drain finger electrodes 22. The drain finger electrode 22 faces the source finger electrode 20 via the gate finger electrode 24.

Like FIG. 4, the insulating layer 34 is arranged so as to cover the gate electrode 24, the substrate 10 between the gate electrode 24 and the source electrode 20, the substrate 10 between the gate electrode 24 and the drain electrode 22, at least a part of the source electrode 20 and at least a part of the drain electrode 22

Like FIG. 4, the shield plate electrode 30 is arranged via the insulating layer 34 over the drain electrode 22 and a first surface of the substrate 10 between the gate electrode 24 and the drain electrode 22, is connected to the source terminal electrodes S1 and S1, and shields electrically the gate electrode 24 and the drain electrode 22 from each other.

The gate terminal electrode G1, the source terminal electrodes S1 and S1, and the drain terminal electrode D1 are arranged on the first surface of the substrate 10. A plurality of the gate finger electrodes 24 are connected to the gate terminal electrode G1 via the gate buses 24a and 24b. A plurality of the source finger electrodes 20 are connected to the source terminal electrodes S1 and S1. A plurality of the drain finger electrodes 22 are connected to the drain terminal electrode D1.

Here, as shown in FIG. 1 and FIG. 21, the source terminal electrodes S1 and S1 are arranged between the gate terminal electrode G1 and the drain terminal electrode D1, and the shield plate electrode 30 is connected to the source terminal electrode S1.

The source terminal electrodes S1 and S1 are arranged between an active region AA and the drain terminal electrode D1.

The semiconductor device 25 concerning the second embodiment is provided with a source bus line SBL which connects the source terminal electrodes S1, S1 and the source electrodes 20, and a drain bus line DBL which connects the drain electrodes 22 and the drain terminal electrode D1 as shown in FIG. 21.

Figure 22:
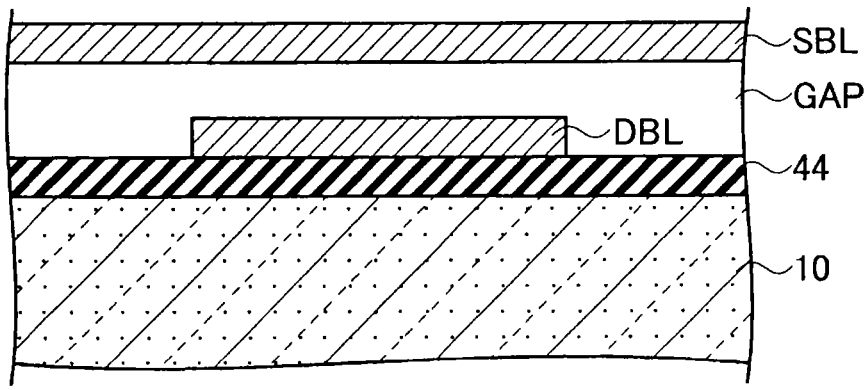
FIG. 22 shows a schematic cross section taken along a VII-VII line of FIG. 21.
Figure 23:
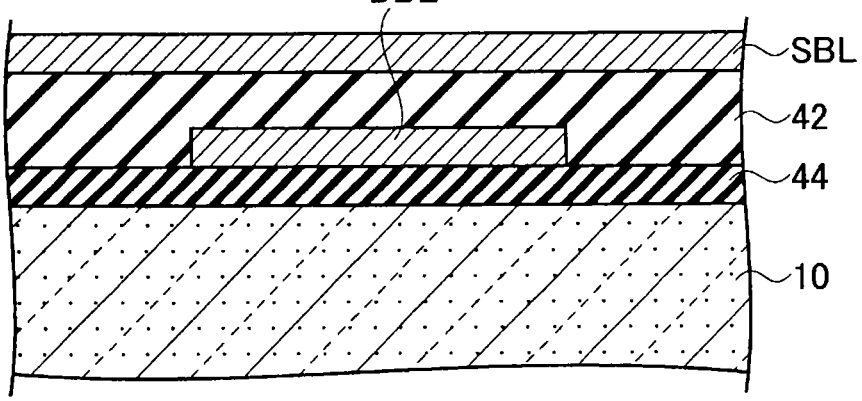
FIG. 23 shows another schematic cross section taken along the VII-VII line of FIG. 21.
Figure 24:
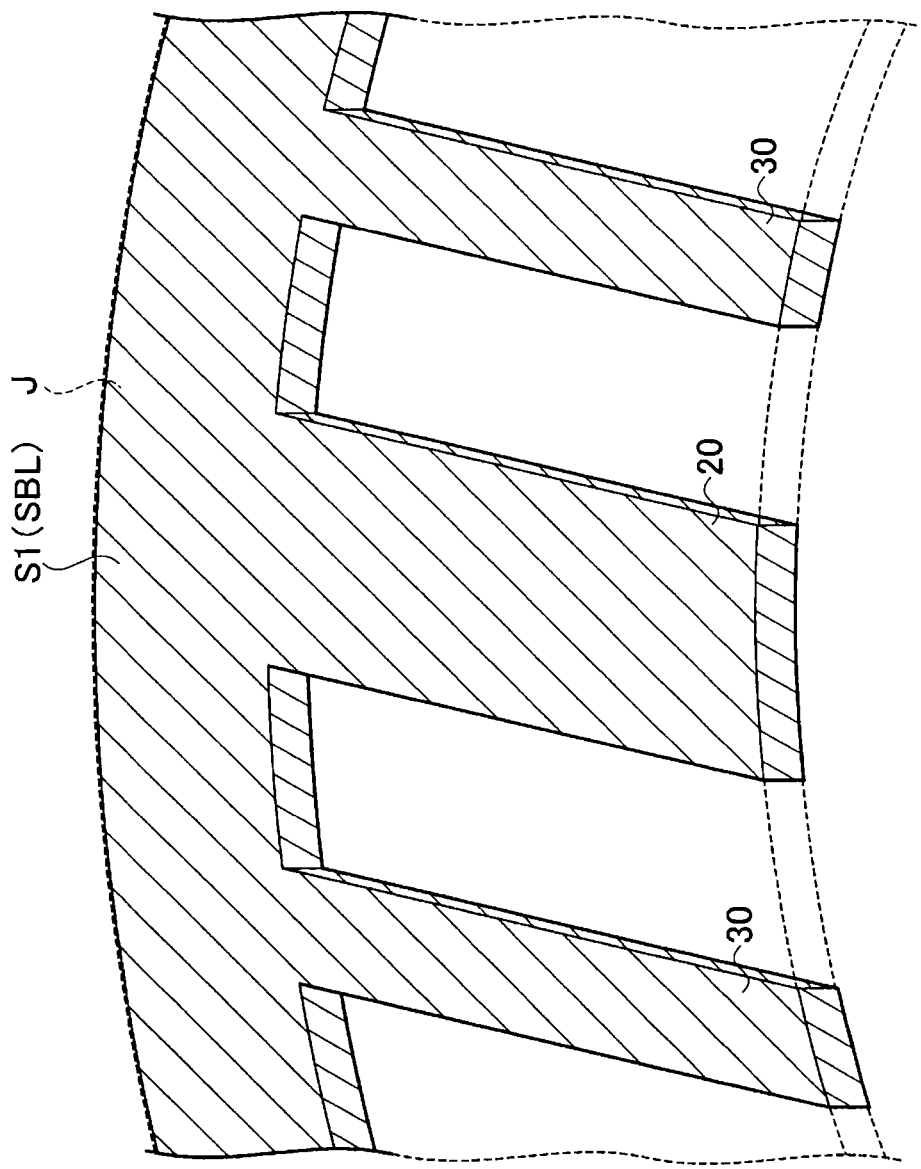
FIG. 24 is a schematic bird's-eye view of a air gap structure of J portion of FIG. 21.

A schematic cross section taken along a VII-VII line of FIG. 21 is shown in FIG. 22, and another schematic cross section taken along the VII-VII line of FIG. 21 is shown in FIG. 23. A schematic bird's-eye view structure of air gap structure of J portion of FIG. 21 is shown in FIG. 24.

The source bus line SBL may be arranged via an air gap GAP over the drain bus line DBL, as shown in FIG. 21 and FIG. 22.

Furthermore, the source bus line SBL may be arranged via an overlay insulating layer 42 over the drain bus line DBL, as shown in FIG. 21 and FIG. 23.

Here, the drain bus line DBL is arranged on a pad insulating film 44 arranged on the substrate 10, as shown in FIG. 22 and FIG. 23.

In the semiconductor device 25 concerning the second embodiment, the source bus line SBL is arranged via the air gap GAP or the overlay insulating layer 42 over the drain bus line DBL, as shown in FIG. 21 and FIG. 24. For this reason, the source bus line SBL or a connection between the source terminal electrode S1 and the source electrode 20 is also made via the air gap GAP or the overlay insulating layer 42.

Similarly, the source bus line SBL or a connection between the source terminal electrode S1 and the shield plate electrode 30 is also made via the air gap GAP or the overlay insulating layer 42. Other composition is the same as that of the first embodiment.

Also in the semiconductor device 25 concerning the second embodiment, the same composition as the first embodiment and its modifications 1 to 5 is applicable. The constructional examples 1 to 4 of the FET cell shown in FIG. 7 to FIG. 10 are applicable similarly.

In the semiconductor device 25 concerning the second embodiment, the source terminal electrodes S1 and S1 are arranged between the active region AA and the drain terminal electrode D1, and the shield plate electrode 30 is connected to the source terminal electrode S1. Under the source terminal electrode S1, a VIA hole SC1 is formed in the substrate 10. The source terminal electrode S1 is connected to the VIA hole SC1.

In the semiconductor device 25 concerning the second embodiment, by arranging the shield plate electrode 30 which is connected to the source terminal electrodes S1, S1 near the drain electrode 22, a drain and a gate are shielded electrically from each other, a capacitance Cgd between the gate and the drain is reduced, an increase in a capacitance Cgs between the gate and a source can be suppressed. Accordingly, concentration of electric field between the gate and the drain can be relaxed without degrading a high-frequency characteristic.

The capacitance Cgd between the gate and the drain can be reduced in the semiconductor device 25 concerning the second embodiment. As a result, S parameter S12 can be reduced and a semiconductor device of high gain can be obtained.

As explained above, according to this embodiment, a semiconductor device of high gain can be provided.

Other Embodiments

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

In addition, as a semiconductor chip carried in the semiconductor device concerning the embodiments, not only an FET and an HEMT but an amplification element, such as an LDMOS (Laterally Diffused Metal-Oxide-Semiconductor Field Effect Transistor), an HBT (Hetero-junction bipolar transistor), etc. are applicable.

What is claimed is:

1. A semiconductor device, comprising:
    a substrate;
    a gate electrode which is arranged on a first surface of the substrate and has a plurality of gate finger electrodes;
    a source electrode which is arranged on the first surface of the substrate and has a plurality of source finger electrodes, and the source finger electrode is close to the gate electrode;
    a drain electrode which is arranged on the first surface of the substrate and has a plurality of drain finger electrodes, and the drain finger electrode faces the source finger electrode via the gate finger electrode;
    a gate terminal electrode which is arranged on the first surface of said substrate and is connected to a plurality of the gate finger electrodes;
    a source terminal electrode which is arranged on the first surface of said substrate and is connected to a plurality of the source finger electrode; a drain terminal electrode which is arranged on the first surface of said substrate and is connected to a plurality of the drain finger electrodes;
    an insulating layer which is arrange to cover the gate finger electrode, the substrate between the gate finger electrode and the source finger electrode, the substrate between the gate finger electrode and the drain finger electrode, and at least a part of the source finger electrode and at least a part of the drain finger electrode; and
    a shield plate electrode which is arranged via the insulating layer over the drain finger electrode and the first surface of the substrate between the gate finger electrode and the drain finger electrode, is short-circuited to the source finger electrode, and shields electrically the gate finger electrode and the drain finger electrode from each other;
    wherein the source terminal electrode is arranged between the gate finger electrodes and the drain terminal electrode, and the shield plate electrode is connected to the source terminal electrode.

2. The semiconductor device according to the claim 1, further comprising:
    a gate bus line which bundles a plurality of the gate finger electrodes and connects a plurality of the gate finger electrodes and the gate terminal electrode, a source bus line which bundles a plurality of the source finger electrodes and connects a plurality of the source finger electrodes and the source terminal electrode, and a drain bus line which bundles a plurality of the drain finger electrodes and connects a plurality of the drain finger electrodes and the drain terminal electrode.

3. The semiconductor device according to the claim 2, wherein the drain bus line is arranged via an overlay insulating layer over the source bus line.

4. The semiconductor device according to the claim 2, wherein the drain bus line is arranged via an air gap over the source bus line.

5. The semiconductor device according to the claim 2, wherein the source bus line is arranged via an overlay insulating layer over the drain bus line.

6. The semiconductor device according to the claim 2, wherein the source bus line is arranged via an air gap over the drain bus line.

7. The semiconductor device according to the claim 1, wherein the shield plate electrode is separated from the gate finger electrode by at least only a distance longer than a thickness of the insulating layer.

8. The semiconductor device according to the claim 1, wherein the shield plate electrode covers at least a part of an upper part of the drain finger electrode via the insulating layer.

9. The semiconductor device according to the claim 1, further comprising a shield plate short circuit line which is arranged on the substrate and short-circuits the shield plate electrode and the source finger electrode.

10. The semiconductor device according to the claim 9, wherein the shield plate short circuit line overlaps with the gate finger electrode.

11. The semiconductor device according to the claim 8, wherein the shield plate short circuit line is arranged via the insulating layer on the gate finger electrode.

12. The semiconductor device according to the claim 9, wherein the shield plate short circuit line is arranged via an air gap on the gate finger electrode.

13. The semiconductor device according to the claim 1, wherein an upper end of the shield plate electrode measured from the first surface of the substrate is higher than an upper end of the gate finger electrode.

14. The semiconductor device according to the claim 1, wherein the substrate is any one of a GaAs substrate, an SiC substrate, a GaN substrate, a substrate in which a GaN epitaxial layer is formed on the SiC substrate, a substrate in which a hetero-junction epitaxial layer which consists of GaN/AlGaN is formed on the SiC substrate, a sapphire substrate and a diamond substrate.

15. The semiconductor device according to the claim 1, wherein the semiconductor device is provided with a GaAs systems HEMT, a GaAs MESFET and a GaN system HEMT.

* * * * *